United States Patent
Lai et al.

(10) Patent No.: US 10,062,654 B2
(45) Date of Patent: Aug. 28, 2018

(54) SEMICONDCUTOR STRUCTURE AND SEMICONDUCTOR MANUFACTURING PROCESS THEREOF

(71) Applicant: Taiwan Semiconductor Manufacturing Co., Ltd., Hsinchu (TW)

(72) Inventors: Yu-Chia Lai, Miaoli County (TW); Chen-Hua Yu, Hsinchu (TW); Chang-Pin Huang, Taoyuan (TW); Chung-Shi Liu, Hsinchu (TW); Hsien-Ming Tu, Hsinchu County (TW); Hung-Yi Kuo, Taipei (TW); Hao-Yi Tsai, Hsinchu (TW); Shih-Wei Liang, Taichung (TW); Ren-Xuan Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/214,463

(22) Filed: Jul. 20, 2016

(65) Prior Publication Data
US 2018/0025997 A1    Jan. 25, 2018

(51) Int. Cl.
| | |
|---|---|
| *H01L 23/52* | (2006.01) |
| *H01L 23/58* | (2006.01) |
| *H01L 23/522* | (2006.01) |
| *H01L 23/31* | (2006.01) |
| *H01L 23/00* | (2006.01) |

(52) U.S. Cl.
CPC ........ *H01L 23/585* (2013.01); *H01L 23/3185* (2013.01); *H01L 23/5226* (2013.01); *H01L 24/05* (2013.01); *H01L 24/17* (2013.01); *H01L 2224/0237* (2013.01); *H01L 2924/01013* (2013.01); *H01L 2924/01022* (2013.01);
(Continued)

(58) Field of Classification Search
CPC ............ H01L 23/525; H01L 23/49816; H01L 2225/1041; H01L 2225/1058; H01L 2224/04105; H01L 2224/0231; H01L 2224/05; H01L 23/564; H01L 23/3185; H01L 23/5226; H01L 23/585; H01L 24/05; H01L 21/565; H01L 2224/0401; H01L 2224/1191; H01L 23/3114
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |

(Continued)

*Primary Examiner* — Khiem D Nguyen
(74) *Attorney, Agent, or Firm* — JCIPRNET

(57) ABSTRACT

A semiconductor structure has an integrated circuit component, a conductive contact pad, a seal ring structure, a conductive via, a ring barrier, and a mold material. The conductive contact pad is disposed on and electrically connected with the integrated circuit component. The seal ring structure is disposed on the integrated circuit component and surrounding the conductive contact pad. The conductive via is disposed on and electrically connected with the conductive contact pad. The ring barrier is disposed on the seal ring structure. The ring barrier surrounds the conductive via. The mold material covers side surfaces of the integrated circuit component. A semiconductor manufacturing process is also provided.

14 Claims, 6 Drawing Sheets

(52) U.S. Cl.
CPC ............... *H01L 2924/01028* (2013.01); *H01L 2924/01029* (2013.01); *H01L 2924/01074* (2013.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2011/0057305 A1* | 3/2011 | Chia | H01L 23/3171 257/700 |
| 2011/0108945 A1* | 5/2011 | Wang | H01L 23/585 257/508 |
| 2011/0291288 A1 | 12/2011 | Wu et al. | |
| 2012/0156830 A1* | 6/2012 | Lachner | H01L 21/561 438/113 |
| 2013/0062760 A1* | 3/2013 | Hung | H01L 21/561 257/738 |
| 2013/0062761 A1 | 3/2013 | Lin et al. | |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0117546 A1* | 5/2014 | Liu | H01L 24/80 257/751 |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2016/0013152 A1* | 1/2016 | Yu | H01L 21/31053 257/773 |
| 2016/0133562 A1* | 5/2016 | Lee | H01L 24/19 257/774 |

* cited by examiner

SEMICONDCUTOR STRUCTURE AND SEMICONDUCTOR MANUFACTURING PROCESS THEREOF

BACKGROUND

Integrated circuits are used in a variety of electronic applications, such as personal computers, cell phones, digital cameras, and other electronic equipment. Integrated circuits are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
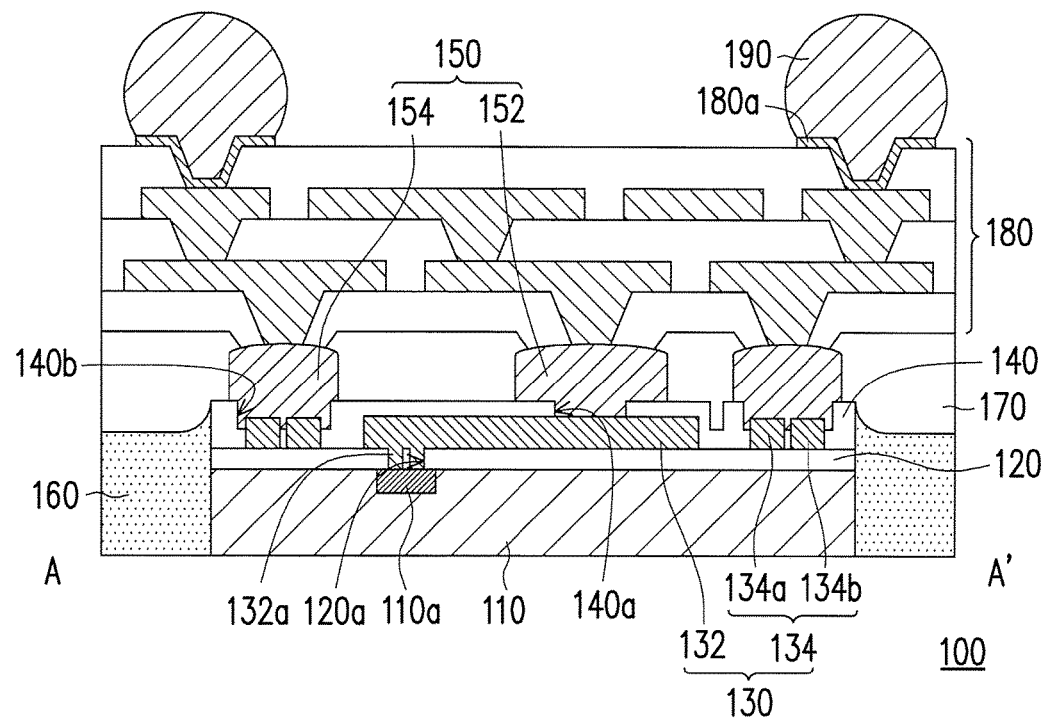
FIG. 1 is a schematic cross sectional view illustrating a semiconductor structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross sectional view illustrating a semiconductor structure according to some exemplary embodiments of the present disclosure. Referring to FIG. 1, in some embodiments, a semiconductor structure 100 includes an integrated circuit component 110 or integrated circuit, a first passivation layer 120, a first patterned conductive layer 130, a second passivation layer 140, and a second patterned conductive layer 150. The first passivation layer 120 is disposed on the integrated circuit component 110. The first patterned conductive layer 130 is disposed on the first passivation layer 120. The second passivation layer 140 is disposed on the first passivation layer 120 and the first patterned conductive layer 130. The second patterned conductive layer 150 is disposed on the second passivation layer 140 and the first patterned conductive layer 130. In some embodiments, the first passivation layer and the second passivation layer are formed of undoped silicate glass (USG), silicon nitride, silicon oxynitride, silicon oxide, or combinations thereof, but is not limited by the above-mentioned materials. In some embodiments, the materials of the first passivation layer and the second passivation layer are the same. However, in other embodiments, the materials of the first passivation layer and the second passivation layer may be different according to user requirements.

In some embodiments, the first patterned conductive layer 130 includes a conductive contact pad 132 and a seal ring structure 134. The seal ring structure 134 surrounds the conductive contact pad 132. The seal ring structure 134 includes two seal rings 134a, 134b. The conductive contact pad 132 is disposed on the first passivation layer 120, and includes at least one contact 132a in contact with the integrated circuit component 110 through at least one opening 120a defined through the first passivation layer 120. In some embodiments, the conductive contact pad 132 has two contacts 132a, and the first passivation layer 120 has two openings 120a through which the conductive contact pad 132 are disposed. However, one of ordinary skill in the art can adjust the number of contacts 132a and openings 120a according to need. The contacts 132a are in contact with a top metal pad 110a of the integrated circuit component 110. Thus, the conductive contact pad 132 is electrically connected with the integrated circuit component 110. In some embodiments, the first patterned conductive layer 130 includes aluminum, titanium, copper, nickel, tungsten, and/or alloys thereof, but is not limited by the above-mentioned materials. In addition, the seal ring structure 134 and the conductive contact pad 132 are made by the same material. However, in other embodiments, the conductive contact pad 132 and the seal ring structure 134 are different materials.

In some embodiments, the second passivation layer 140 is disposed on the first passivation layer 120 and encapsulates the first patterned conductive layer 130. In some embodiments, as seen in FIG. 1, the second passivation layer 140 includes a first opening 140a and a second opening 140b. However, the disclosure is not limited thereto, and one of ordinary skill in the art can adjust the number of first openings 140a and second openings 140b according to need. In some embodiments, the first opening 140a exposes a portion of the conductive contact pad 132, and the second opening 140b exposes the seal ring structure 134. The seal ring structure 134 surrounds the conductive contact pad 132 and has a ring shape (e.g., an enclosed surrounding profile). Thus, the second opening 140b that exposes the seal ring structure 134 also has comparable ring shape surrounding the conductive contact pad 132. The ring shape of the seal ring structure 134 is fully laterally enclosing the conductive contact pad 132. That is to say, the seal ring structure 134 is continuously enclosing without any gaps in between. The second opening 140b has a similar shape. Thus, during a wafer dicing process, the seal ring structure 134 can stop undesirable damaging towards the integrated circuit component 110. In addition, the seal ring structure 134 can enable structural reinforcement of the semiconductor structure 100, thereby preventing operational reliability of the integrated circuit component 110 from being degraded. In some other embodiments, the seal ring structure 134 is constituted of segments that laterally surround and enclose the conductive contact pad 132. That is to say, the seal ring structure 134 surrounds the conductive contact pad 132 without being continuously enclosing, and has gaps between each of the segments. The second opening 140b has a similar shape.

As seen in FIG. 1, in some embodiments, the second patterned conductive layer 150 is disposed on the second passivation layer 140 and the first patterned conductive layer 130. The second patterned conductive layer 150 includes a conductive via 152 and a ring barrier 154. The conductive via 152 is disposed on the second passivation layer 140 and includes a portion in contact with the conductive contact pad 132 through the first opening 140a. That is to say, the conductive via 152 is disposed on and electrically connected with the conductive contact pad 132. The ring barrier 154 is disposed on the seal ring structure 134 and the second passivation layer 140 as seen in FIG. 1. That is to say, the ring barrier 154 is in contact with the seal ring structure 134 through the second opening 140b.

In some embodiments, the ring barrier 154 has a ring shape similar to the ring shape of the seal ring structure 134 and the second opening 140b. That is to say, the ring barrier 154 completely covers the seal ring structure 134 and surrounds the conductive via 152 and the conductive contact pad 132 similar to the seal ring structure 134 surrounding the conductive contact pad 132. In some embodiments, a height of the conductive via 152 is substantially the same as a height of the ring barrier 154. That is to say, the second patterned conductive layer 150 having the ring barrier 154 and the conductive via 152 has substantially the same height. The height of the conductive via 152 and the ring barrier 154 is between 3 and 7 micrometers. In other embodiments, the height of the ring barrier 154 is greater than the height of the conductive via 152. The material of the conductive via 152 and the ring barrier 154 includes aluminum, titanium, copper, nickel, tungsten, and/or alloys thereof, but is not limited by the above-mentioned materials. In addition, the ring barrier 154 and the conductive via 152 are made by the same material. However, in other embodiments, the ring barrier 154 and the conductive via 152 are different materials. Furthermore, a width of the ring barrier 154 is greater than a width of the seal ring structure 134. The width of the ring barrier 154 is between 48 and 52 micrometers. In addition, the height of the ring barrier 154 is greater than the height of the seal ring structure 134.

In some embodiments, as seen in FIG. 1, a mold material 160 covers the side surfaces of the integrated circuit component 110. The mold material 160 includes, for example, an epoxy resin, or any other suitable type of molding material. In some embodiments, the mold material covers the sides of the first passivation layer 120 and the second passivation layer 140. However, in some embodiments, the mold material 160 only covers the side surfaces of the integrated circuit component 110.

Figure 2:
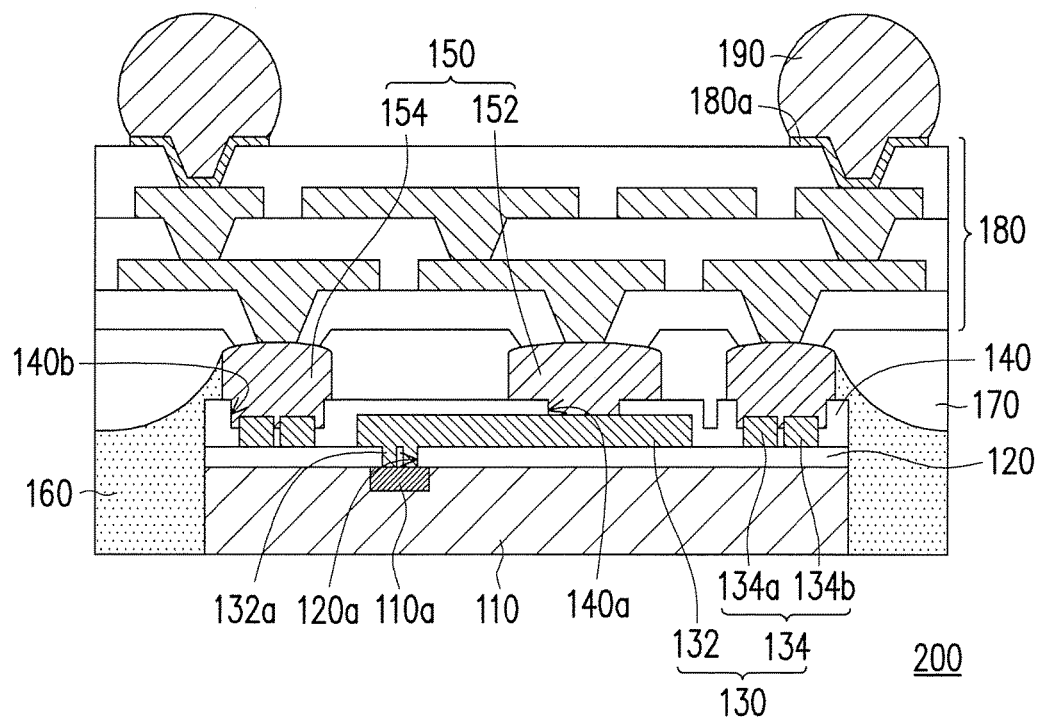
FIG. 2 is a schematic cross sectional view illustrating a semiconductor structure according to some other exemplary embodiments of the present disclosure.

FIG. 2 is a schematic cross sectional view illustrating a semiconductor structure according to some other exemplary embodiments of the present disclosure. As seen in FIG. 2, the semiconductor structure 200 is structurally comparable to the semiconductor structure 100, and thus retains the same element numerals used in the previous example. The difference is, in some embodiments, as seen in FIG. 2, the mold material 160 also covers the sides surfaces of the ring barrier 154. That is to say, the mold material 160 formed during a molding process covers the side surfaces of the ring barrier 154. The height at which the mold material 160 covers to the side surfaces of the ring barrier 154 may differ in different molding processes. That area in which the mold material 160 covers the ring barrier 154 or the second passivation layer 140 varies. FIG. 2 shows an example of the mold material 160 covering all the way near the top of the ring barrier 154. Thus, it can be seen that the ring barrier 154 is able to prevent the mold material 160 from encapsulating the seal ring 134 and the conductive contact pad 132.

Figure 3:
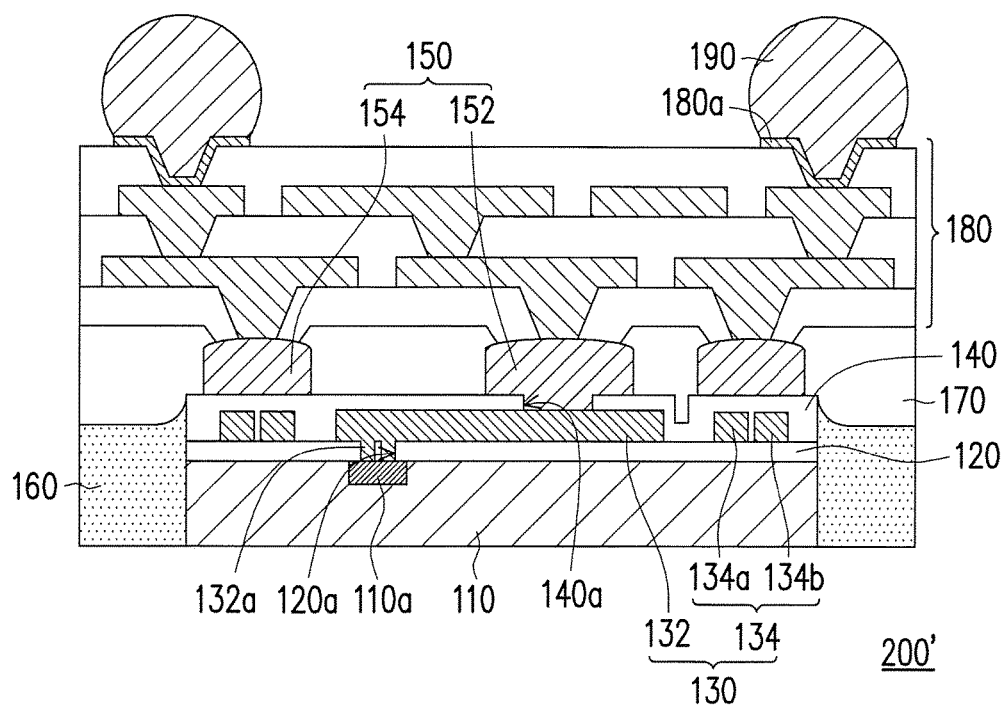
FIG. 3 is a schematic cross sectional view illustrating a semiconductor structure according to some other exemplary embodiments of the present disclosure.

FIG. 3 is a schematic cross sectional view illustrating a semiconductor structure according to some other exemplary embodiments of the present disclosure. As seen in FIG. 3, the semiconductor structure 200' is the same as the semiconductor structure 100, and all the same elements use the same reference numerals. The difference is, in some embodiments, as seen in FIG. 2, the second passivation layer 140 covers the seal ring structure 134 and does not include a second opening 140b in FIG. 1. In some embodiments, the second passivation layer 140 covers the seal ring structure 134, and so the ring barrier 154 is disposed on the second passivation layer 140 and does not contact the seal ring structure 134. That is to say, in some embodiments, if the second openings 140b (shown in FIG. 1) are not formed, and the ring barrier 154 is formed on the second passivation layer 140, and does not contact the seal ring structure 134. In addition, if the second openings 140b are not formed, then the ring barriers 154 and the conductive vias 152 do not have to be formed at the same time. Depending on user requirements, the patterning of the second passivation layer 140 to form the second openings 140b may be omitted.

Referring back to FIG. 1, in some embodiments, the semiconductor structure 100 further includes a dielectric layer 170, disposed on the mold material 160 and the second passivation layer 140. The dielectric layer 170 includes a plurality of openings 170a exposing the ring barrier 154 and the conductive via 152. The material of the dielectric material layer 170 includes polymer, polymide, benzocyclobutene (BCB), polybenzooxazole (PBO), or any other suitable dielectric material.

In addition, in some embodiments, the semiconductor structure further includes a redistribution layer 180, disposed on the dielectric layer 170, the ring barrier 154, and the conductive via 152. The redistribution layer 180 includes at least one contact pad 180a electrically connected to the ring barrier 154 and the conductive via 152. Furthermore, at least one conductive terminal 190 is disposed on the at least one contact pad 180a. In FIG. 1, two contact pads 180a and two conductive terminals 190 are shown. However, one of ordinary skill in the art may change the number of contact pads 180a and conductive terminals 190 according to user requirements. The conductive terminals 190 are conductive bumps, balls, or any other suitable conductive terminals. Since the contact pad 180a is electrically connected to the ring barrier 154 and the conductive via 152, the conductive terminals 190 are also electrically connected to the ring barrier 154 and the conductive via 152. This way, the conductive terminals 190 are electrically connected to the integrated circuit component 110. In some embodiments, the ring barrier 154 is electrically floating, and the contact pad 180a is not electrically connected to the ring barrier 154. In other embodiments, the ringer barrier 154 is connected to ground. The actual arrangement may depend on the practical routing requirement of the respective semiconductor structure.

In some embodiments, the redistribution layer 180 is formed by dielectric material layers and metallization layers layer by layer. In some embodiments, the redistribution layer 180 may include more or less than the number of dielectric material layers shown in FIG. 1. In alternative embodiments, the redistribution layer 180 may include more or less than the number of metallization layers shown. The number of metallization layers and the number of dielectric material layers may be adjusted depending on the routing requirement of the respective semiconductor structure. The description of the material of the dielectric material layers in the redistribution layer 180 is the same as the dielectric layer 170. The same or different materials may be used. The material of the metallization layers and the contact pad 180a includes aluminum, titanium, copper, nickel, tungsten, and/or alloys thereof, but is not limited by the above-mentioned materials.

Figure 4:
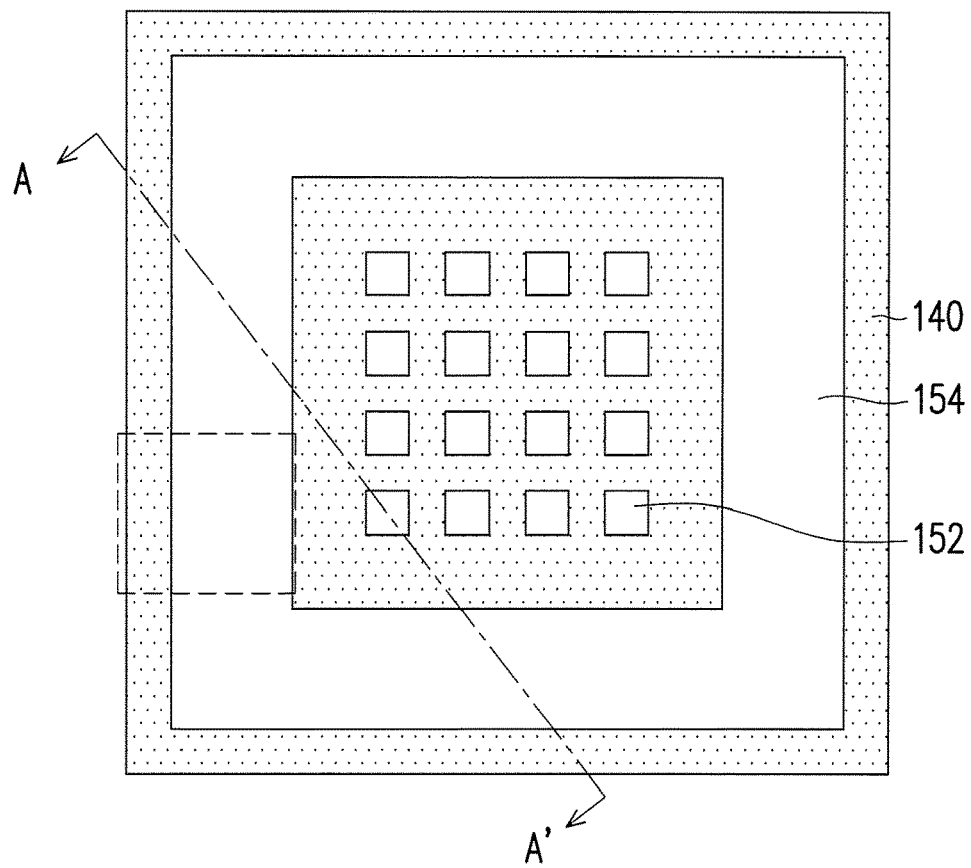
FIG. 4 is a schematic top view illustrating the semiconductor structure according to FIG. 1.

FIG. 4 is a schematic top view illustrating the semiconductor structure according to FIG. 1. The cross-section shown in FIG. 1 may reflect a cross section of the top view shown in FIG. 4 along the line A-A'. Referring to FIG. 4, the semiconductor structure shown in FIG. 4 does not include the molding compound 160, the redistribution layer 180, the dielectric layer 170, and the conductive terminal 190. FIG. 4 shows a top view of the semiconductor structure 100 and the configuration of the second patterned conductive layer 150. As seen in FIG. 4, in some embodiments, the semiconductor structure 100 includes a plurality of conductive vias 152. The number of conductive vias 152 of the semiconductor structure 100 may be adjusted by one of ordinary skill in the art according to need. It is seen that the ring barrier 154 of the second patterned conductive layer 150 is a ring shape surrounding the conductive vias 152. Similarly, the seal ring structure 134 underneath the ring barrier 154, and the second opening 140b also have a ring shape.

Figure 5:
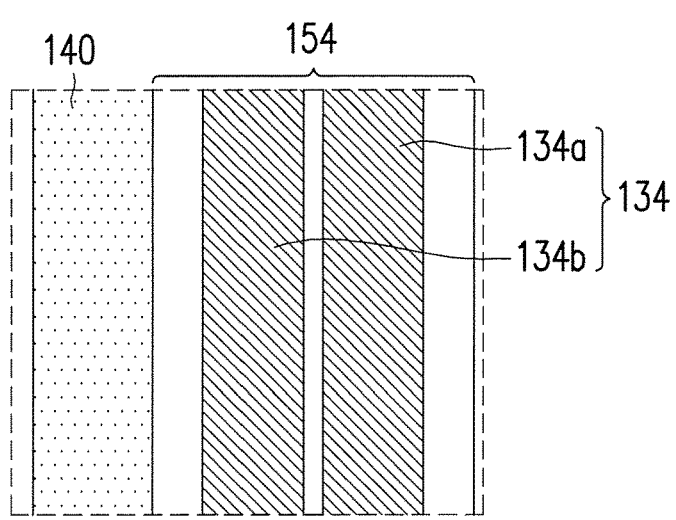
FIG. 5 is an enlarged partial schematic view of the semiconductor structure according to FIG. 4.

FIG. 5 is an enlarged partial schematic view of the semiconductor structure according to FIG. 4. As seen in FIG. 5, FIG. 5 has the ring barrier 154 transparent to show the seal ring structure 134 underneath the ring barrier 154. In some embodiments, the seal ring structure 134 includes the two seal rings 134a, 134b. However, the disclosure is not limited thereto, and one of ordinary skill in the art may adjust the number of seal rings in the seal ring structure 134. FIG. 6 to FIG. 14 are schematic cross sectional views of various stages in a semiconductor manufacturing process of a semiconductor structure according to some exemplary embodiments of the present disclosure. Specifically, the stages in FIG. 6 to FIG. 10 are performed on a wafer. The wafer includes a plurality of the integrated circuit components 110. The following steps in FIG. 6 to FIG. 10 show the manufacturing process on one integrated circuit component 110 of the wafer. However, manufacturing process is performed on all the integrated circuit components 110 of the wafer.

Figure 6:
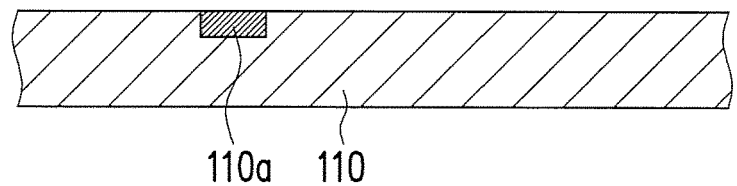
FIG. 6 to FIG. 14 are schematic cross sectional views of various stages in a semiconductor manufacturing process of a semiconductor structure according to some exemplary embodiments of the present disclosure.
Figure 7:
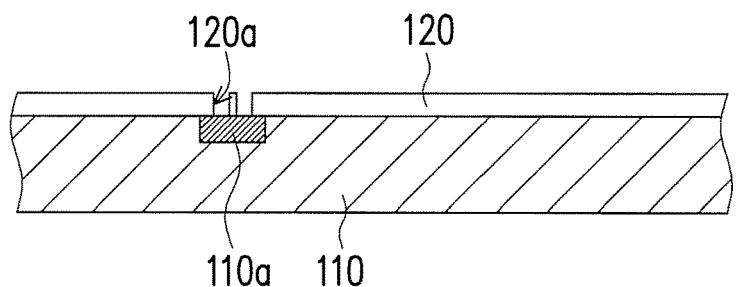

Referring to FIG. 6, FIG. 6 shows the integrated circuit component 110 of the wafer. Referring to FIG. 7, a first passivation layer 120 is formed on the integrated circuit component 110 of the wafer. The integrated circuit component 110 includes the top metal pad 110a. During the process of forming the first passivation layer 120, the first passivation layer 120 is deposited on the wafer and the integrated circuit components 110. The first passivation layer 120 is then patterned to form the openings 120a. The description of the first passivation layer 120 can be referred to above, and will not be repeated herein.

Figure 8:
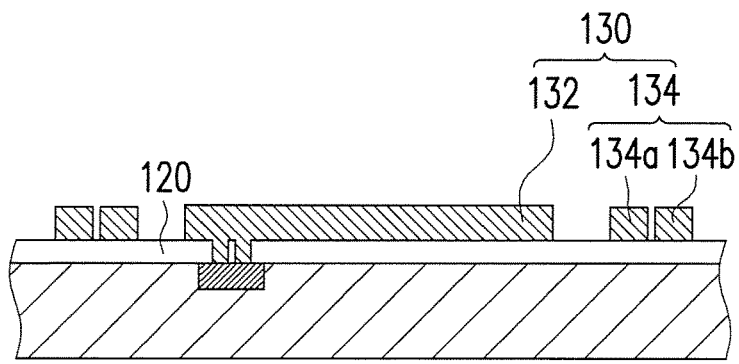

Referring to FIG. 8, the first patterned conductive layer 130 is formed on the first passivation layer 120. The first patterned conductive layer 130 is formed by, for example, deposition, sputtering, electroplating, or any other suitable method. Through the method of forming the first patterned conductive layer 130, the seal ring structure 134 and the conductive contact pad 132 are formed. That is to say, the seal ring structure 134 and the conductive contact pad 132 are formed simultaneously. However, in other embodiments, the seal ring structure 134 and the conductive contact pad 132 may be formed separately at different times. Furthermore, the first patterned conductive layer 130 is formed across the entire wafer, and so a plurality of seal ring structures 134 and conductive contact pads 132 are formed on the integrated circuit components 110. The description of the first patterned conductive layer 130 can be referred to above, and will not be repeated herein.

Figure 9:
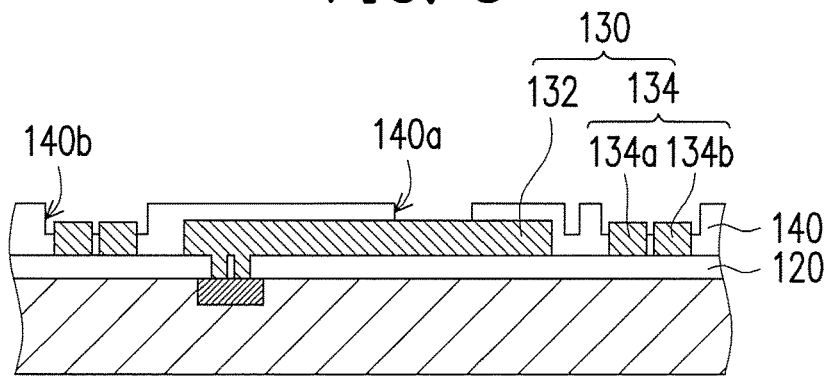

Referring to FIG. 9, in some embodiments, the second passivation layer 140 is formed on the first patterned conductive layer 130 and the first passivation layer 120. During the process of forming the second passivation layer 140, the second passivation layer 140 is deposited on the wafer and the integrated circuit components 110. The second passivation layer 140 thus covers the seal ring structure 134 and the conductive contact pad 132 of the first conductive layer 130, and also covers the first passivation layer 120. The second passivation layer 140 is then patterned to form the first openings 140a and the second openings 140b. The description of the second passivation layer 140 can be referred to above, and will not be repeated herein. Similar to the description of the second passivation layer 140 FIG. 3, the second openings 140b may also be omitted if desired by the user.

Figure 10:
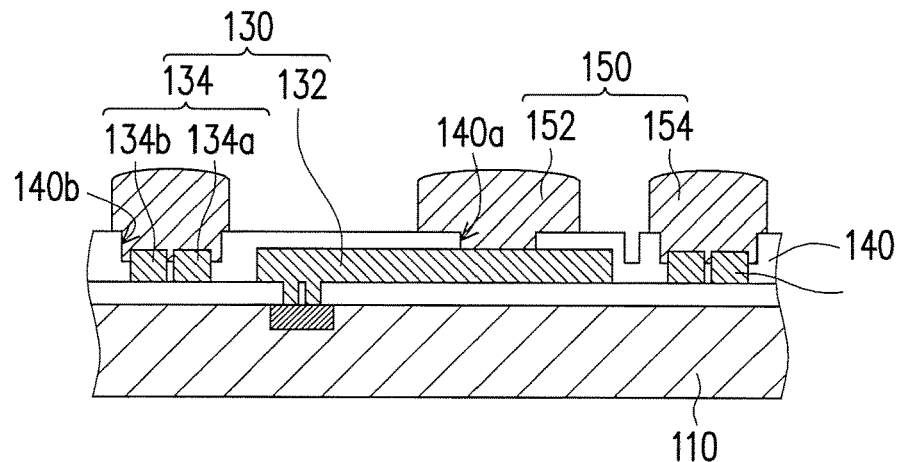

Referring to FIG. 10, in some embodiments, the second patterned conductive layer 150 is formed on the second passivation layer 140. The second patterned conductive layer 150 is formed by, for example, deposition, sputtering, electroplating, or any other suitable method. Through the method of forming the second patterned conductive layer 150, the ring barrier 154 and the conductive via 152 are formed. That is to say, the ring barrier 154 and the conductive via 152 are formed simultaneously. However, in other embodiments, the ring barrier 154 and the conductive via 152 may be formed separately at different times. Furthermore, the second patterned conductive layer 150 is formed across the entire wafer, and so a plurality of ring barriers 154 and conductive vias 152 are formed on the integrated circuit components 110. Referring to FIG. 3, in some embodiments, if the second openings 140b are not formed, then the ring barrier 154 is formed on the second passivation layer 140, and does not contact the seal ring structure 134. In addition, if the second openings 140b are not formed, then the ring barriers 154 and the conductive vias 152 are not formed at the same time. In FIG. 9, the second openings 140b are formed, and in FIG. 10 the ring barrier 154 is formed on the second passivation layer 140 and the seal ring structure 134, and is in contact with the seal ring structure 134. In FIG. 10, the ring barriers 154 and the conductive vias 152 are formed simultaneously. The description of the second patterned conductive layer 150 can be referred to above, and will not be repeated herein. After the second patterned conductive layer 150 is formed, the integrated circuit components 110 are singulated. That is to say, the wafer undergoes a wafer dicing process (not shown) to separate the integrated circuit components 110 into individual integrated circuit components 110. During the wafer dicing process, the seal ring structure 134 can stop undesirable damaging towards the integrated circuit component 110. In addition, the seal ring structure 134 can enable structural reinforcement of the semiconductor structure 100, thereby preventing operational reliability of the integrated circuit component 110 from being degraded.

Referring to FIG. 11 to FIG. 14, the processes in FIG. 11 to FIG. 14 are performed on a carrier 300. Specifically, referring to FIG. 11, after the wafer dicing process to saw the wafer and individualize the integrated circuit components 110, each of the integrated circuit components 110 are mounted onto the carrier 300. The processes in FIG. 11 to FIG. 14 are performed on multiple integrated circuit components 110 on the carrier 300, but only one is shown for illustrative purposes. In addition, prior to the integrated circuit components 110 being mounted onto the carrier 300, optionally, a debond layer (not shown), may be first coated onto the carrier 300, and a dielectric layer (not shown), may be coated on the debond layer. The integrated circuit components 110 are then mounted onto the dielectric layer and debond layer of the carrier 300.

Figure 11:
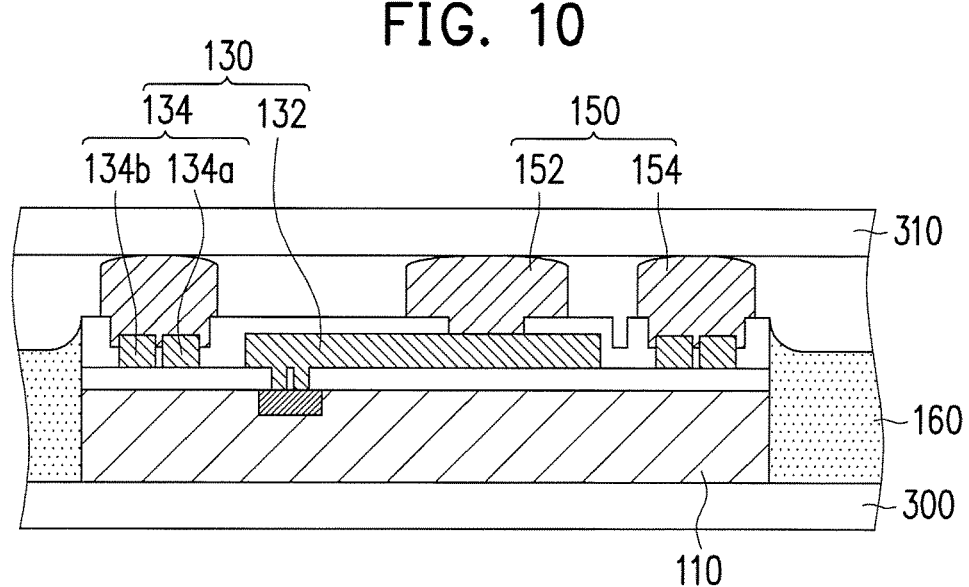

Further referring to FIG. 11, a release film 310 is disposed on the second patterned conductive layer 150. After the release film 310 is disposed on the second patterned conductive layer 150, the molding material 160 is formed on the carrier 300 encapsulating the sidewalls of the integrated circuit component 110. Specifically, the molding material 160 is formed across the entire carrier 300, and so all of the integrated circuit components 110 disposed on the carrier 300 are encapsulated by the molding material 160. In some embodiments, as shown in FIG. 2, when the molding material 160 is formed, the molding material 160 also covers the sidewalls of the ring barrier 154. Since the ring barrier 154 is substantially the same height as the conductive via 152, the release film 310 adequately adheres to the integrated circuit component 110. In addition, when the molding material 160 is formed, the ring barrier 154 is able to block the molding material 160 from encapsulating the seal ring 134 and the conductive contact pad 132. Thus, if the molding material 160 that is formed reaches the ring barrier 154, as shown in FIG. 2, the ring barrier 154 blocks the molding material 160 from further covering the seal ring structure 134 and the conductive contact pad 132. Furthermore, if the molding material 160 reaches past the height of the ring barrier 154, the release film blocks the molding material 160 from covering the ring barrier 154 and entering the area surrounded by the ring barrier 154. This way, the presence of over molding or residue concern after forming the molding material 160 may be prevented.

Figure 12:
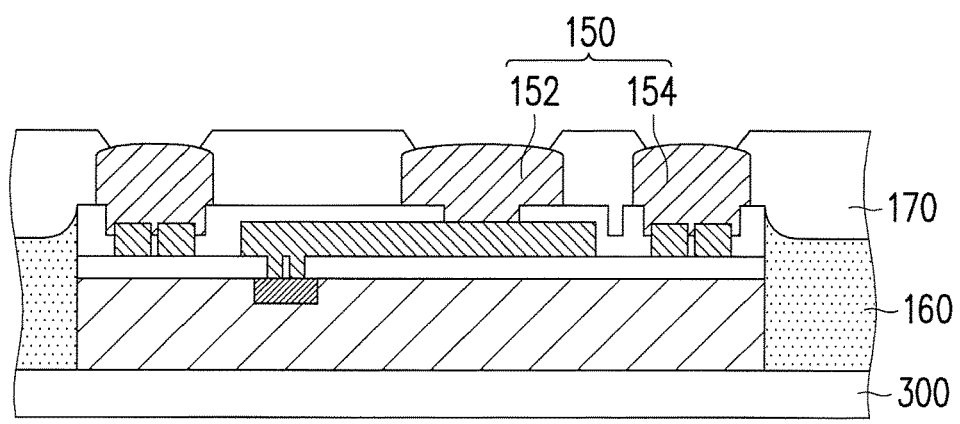

Referring to FIG. 12, in some embodiments, the release film 310 is removed after the molding material 160 is formed as shown in FIG. 12. Then the dielectric layer 170 is formed on the molding material 160 and the second patterned conductive layer 150. During the process of forming the dielectric layer 170, the dielectric layer 170 is deposited across the entire carrier 300, covering the second patterned conductive layer 150 and the molding material 160. The dielectric layer 170 is then patterned to form openings that expose the ring barrier 154 and the conductive via 152. The description of the dielectric layer 170 can be referred to above, and will not be repeated herein.

Figure 13:
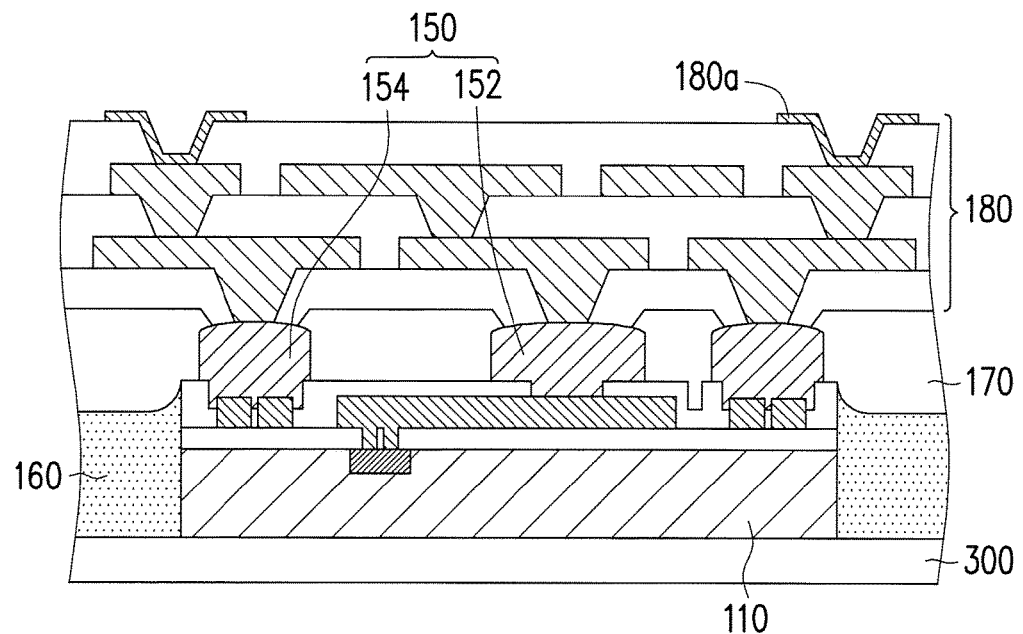

Referring to FIG. 13, in some embodiments, the redistribution layer 180 is formed on the dielectric layer 170 and the second patterned conductive layer 150. The redistribution layer 180 is formed by dielectric material layers and metallization layers layer by layer. The number of metallization layers and the number of dielectric material layers may be adjusted depending on the routing requirement of the respective semiconductor structure. The contact pads 180a of the redistribution layer 180 are formed at the top metallization layer of the redistribution layer 180. The description of the redistribution layer 180 can be referred to above, and will not be repeated herein.

Figure 14:
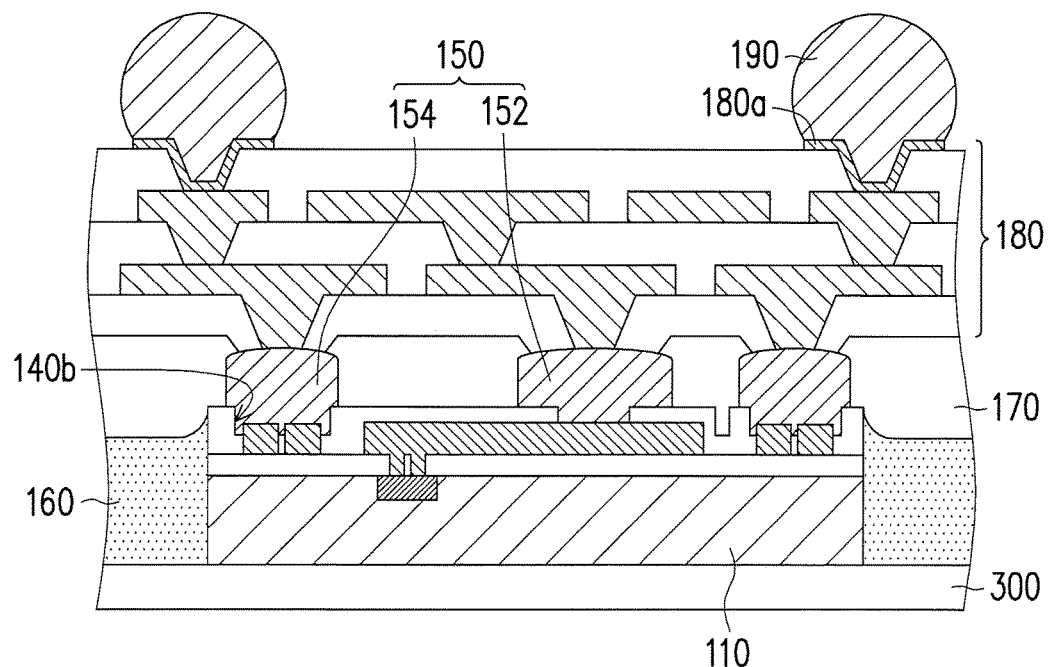

Referring to FIG. 14, in some embodiments, after the redistribution layer 180 is formed, the conductive terminals 190 are disposed on the contact pads 180a. The description of the contact pads 180a can be referred to above, and will not be repeated herein. At this point, the semiconductor structure 100 formed on the carrier 300 is complete. The semiconductor structure 100 may also be referred to as a semiconductor package. After forming the semiconductor structure 100, each semiconductor structure is debonded from the carrier and singulated to show the complete semiconductor structure 100 or semiconductor package as seen in FIG. 1.

According to some embodiments, a semiconductor structure has an integrated circuit component, a conductive contact pad, a seal ring structure, a conductive via, a ring barrier, and a mold material. The conductive contact pad is disposed on and electrically connected with the integrated circuit component. The seal ring structure is disposed on the integrated circuit component and surrounding the conductive contact pad. The conductive via is disposed on and electrically connected with the conductive contact pad. The ring barrier is disposed on the seal ring structure. The ring barrier surrounds the conductive via. The mold material covers side surfaces of the integrated circuit component.

According to some embodiments, a semiconductor structure has an integrated circuit component, a first passivation layer, a first patterned conductive layer, a conductive contact pad, a seal ring structure, a second passivation layer, a conductive via, a ring barrier, and a mold material. The first passivation layer is disposed on the integrated circuit component. The first patterned conductive layer is disposed on the first passivation layer. The first patterned conductive layer includes a conductive contact pad electrically connected to the integrated circuit component and a seal ring structure surrounding the conductive contact pad. The second passivation layer is disposed on the first passivation layer and covers the first patterned conductive layer. The second passivation layer includes at least one first opening exposing the conductive contact pad. The second patterned conductive layer is disposed on the second passivation layer. The second patterned conductive layer includes a conductive via electrically connected to the conductive contact pad. The second patterned conductive layer further includes a ring barrier disposed on the seal ring structure, and the ring barrier surrounds the conductive via. The mold material covers side surfaces of the integrated circuit component.

According to some embodiments, a semiconductor manufacturing process includes the following steps. A first passivation layer is formed on a wafer having at least one integrated circuit component. The first passivation layer includes at least one opening exposing the at least one integrated circuit component. A first patterned conductive layer is formed on the first passivation layer. The first patterned conductive layer includes at least one seal ring structure and at least one conductive contact pad, the at least one conductive contact pad is electrically connected to the at least one integrated circuit component, and the at least one seal ring structure surrounds the at least one conductive contact pad. A second passivation layer is formed on the first patterned conductive layer and the first passivation layer. A second patterned conductive layer is formed on the second passivation layer. The second patterned conductive layer includes at least one conductive via and at least one ring barrier, the at least one conductive via is electrically connected to the at least one conductive contact pad, the at least one ring barrier is disposed on the at least one seal ring structure, and the at least one ring barrier surrounds the at least one conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   an integrated circuit;
   a conductive contact pad, disposed on and electrically connected with the integrated circuit;
   a seal ring structure, disposed on the integrated circuit and surrounding the conductive contact pad;
   a conductive via, disposed on and electrically connected with the conductive contact pad;
   a ring barrier, disposed on top of the seal ring structure, wherein the seal ring structure and the ring barrier are distributed within a first side and second side of the integrated circuit, and the ring barrier surrounds the conductive via;
   a first passivation layer, sandwiched between the conductive contact pad and the conductive via, wherein the first passivation layer comprises at least one first opening exposing a portion of the conductive contact pad mechanically connected to the conductive via; and
   a mold material covering side surfaces of the integrated circuit.

2. The semiconductor structure as claimed in claim 1, wherein a height of the conductive via is substantially the same as a height of the ring barrier.

3. The semiconductor structure as claimed in claim 1, further comprising:
   a second passivation layer, disposed on the integrated circuit, wherein the conductive contact pad and seal ring structure are disposed on the second passivation layer, and the second passivation layer comprises at least one opening exposing the integrated circuit,
   wherein the first passivation layer is disposed on the second passivation layer and covering a portion of the seal ring structure and a portion of the conductive contact pad, wherein the first passivation layer comprises a plurality of second openings exposing the seal ring structure.

4. The semiconductor structure as claimed in claim 3, further comprising a dielectric layer, disposed on the mold material and the first passivation layer, wherein the dielectric layer includes a plurality of openings exposing the ring barrier and the conductive via;
   a redistribution layer, disposed on the dielectric layer, the ring barrier, and the conductive via, wherein the redistribution layer includes at least one contact pad electrically connected to the ring barrier and the conductive via; and
   at least one conductive terminal, disposed on the at least one contact pad.

5. The semiconductor structure as claimed in claim 1, wherein the mold material covers side surfaces of the ring barrier.

6. The semiconductor structure as claimed in claim 1, wherein a width of the ring barrier is greater than a width of the seal ring structure.

7. The semiconductor structure as claimed in claim 1, wherein a height of the ring barrier is greater than a height of the seal ring.

8. A semiconductor structure comprising:
   an integrated circuit;
   a first passivation layer, disposed on the integrated circuit;
   a first patterned conductive layer, disposed on the first passivation layer, wherein the first patterned conductive layer comprises:
      a conductive contact pad, electrically connected to the integrated circuit; and
      a seal ring structure surrounding the conductive contact pad;
   a second passivation layer, disposed on the first passivation layer and covering the first patterned conductive layer, wherein the second passivation layer comprises at least one first opening exposing a portion of the conductive contact pad mechanically connected to a conductive via;
   a second patterned conductive layer, disposed on the second passivation layer, wherein the second patterned conductive layer comprises:
      the conductive via, electrically connected to the conductive contact pad; and
      a ring barrier, disposed on top of the seal ring structure, wherein the seal ring structure and the ring barrier are distributed within a first side and second side of the integrated circuit, and the ring barrier surrounds the conductive via; and
   a mold material covering side surfaces of the integrated circuit.

9. The semiconductor structure as claimed in claim 8, wherein the second passivation layer further comprises at least one second opening exposing the seal ring structure.

10. The semiconductor structure as claimed in claim 8, wherein a height of the conductive via is substantially the same as a height of the ring barrier.

11. The semiconductor structure as claimed in claim 8, further comprising a dielectric layer, disposed on the mold material and the second passivation layer, wherein the dielectric layer includes a plurality of third openings exposing the ring barrier and the conductive via;
   a redistribution layer, disposed on the dielectric layer, the ring barrier, and the conductive via, wherein the redistribution layer includes at least one contact pad electrically connected to the ring barrier and the conductive via; and
   at least one conductive terminal, disposed on the at least one contact pad.

12. The semiconductor structure as claimed in claim 8, wherein the mold material covers side surfaces of the ring barrier.

13. The semiconductor structure as claimed in claim 8, wherein a width of the ring barrier is larger than a width of the seal ring structure.

14. The semiconductor structure as claimed in claim 8, wherein a height of the ring barrier is greater than a height of the seal ring.

* * * * *